(12) United States Patent
Yin et al.

(10) Patent No.: US 8,906,753 B2
(45) Date of Patent: Dec. 9, 2014

(54) SEMICONDUCTOR STRUCTURE AND METHOD FOR MANUFACTURING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 358 days.

(21) Appl. No.: 13/380,857

(22) PCT Filed: Aug. 25, 2011

(86) PCT No.: PCT/CN2011/078877
§ 371 (c)(1), (2), (4) Date: Dec. 26, 2011

(87) PCT Pub. No.: WO2013/000196
PCT Pub. Date: Mar. 1, 2013

(65) Prior Publication Data
US 2014/0124859 A1 May 8, 2014

(30) Foreign Application Priority Data

Jun. 27, 2011 (CN) .......................... 2011 1 0175568

(51) Int. Cl.
| | | |
|---|---|---|
| H01L 21/28 | (2006.01) |
| H01L 29/417 | (2006.01) |
| H01L 29/66 | (2006.01) |
| H01L 29/423 | (2006.01) |
| H01L 29/78 | (2006.01) |

(52) U.S. Cl.
CPC .... *H01L 21/28008* (2013.01); *H01L 29/41733* (2013.01); *H01L 29/66772* (2013.01); *H01L 29/4232* (2013.01); *H01L 29/78* (2013.01); *H01L 29/66643* (2013.01); *H01L 29/7839* (2013.01); *H01L 29/66545* (2013.01)

USPC .......... 438/151; 438/162; 438/424; 257/288; 257/327; 257/345; 257/347; 257/349

(58) Field of Classification Search
CPC ....................................................... H01L 21/28
USPC ........... 257/327, 345, 347, 349; 438/162, 424
See application file for complete search history.

(56) References Cited

U.S. PATENT DOCUMENTS 6,649,964 B2 * 11/2003 Kim ............................... 257/308
6,924,517 B2 * 8/2005 Chen et al. ..................... 257/213
(Continued)

OTHER PUBLICATIONS

International Preliminary Report on Patentability for PCT/CN2011/078877, Jan. 7, 2014.

*Primary Examiner* — Matthew W Such
*Assistant Examiner* — Stephen C Smith
(74) *Attorney, Agent, or Firm* — Treasure IP Group, LLC

(57) ABSTRACT

The present invention provides a method for manufacturing a semiconductor structure, which comprises: providing an SOI substrate, forming a gate structure on the SOI substrate; etching an SOI layer of the SOI substrate and a BOX layer of the SOI substrate on both sides of the gate structure to form trenches, the trenches exposing the BOX layer and extending partly into the BOX layer; forming sidewall spacers on sidewalls of the trenches; forming inside the trenches a metal layer covering the sidewall spacers, wherein the metal layer is in contact with the SOI layer which is under the gate structure. Accordingly, the present invention further provides a semiconductor structure formed according to aforesaid method. The manufacturing method and the semiconductor structure according to the present invention make it possible to reduce capacitance between a metal layer and a body silicon layer of an SOI substrate when a semiconductor device is in operation, which is therefore favorable for enhancing performance of the semiconductor device.

18 Claims, 10 Drawing Sheets

(56) References Cited

U.S. PATENT DOCUMENTS

| | | | |
|---|---|---|---|
| 7,452,761 B2* | 11/2008 | Zhu et al. | 438/155 |
| 7,541,629 B1* | 6/2009 | Zhu et al. | 257/288 |
| 7,569,447 B2* | 8/2009 | Yang et al. | 438/199 |
| 8,021,956 B2* | 9/2011 | Ren et al. | 438/424 |
| 8,466,013 B2* | 6/2013 | Yin et al. | 438/149 |
| 8,669,146 B2* | 3/2014 | Abou-Khalil et al. | 438/151 |
| 2002/0119608 A1* | 8/2002 | Ko et al. | 438/152 |
| 2006/0131648 A1* | 6/2006 | Ahn et al. | 257/347 |
| 2008/0121985 A1* | 5/2008 | Chen et al. | 257/327 |
| 2010/0171118 A1* | 7/2010 | Saha et al. | 257/51 |

* cited by examiner

SEMICONDUCTOR STRUCTURE AND METHOD FOR MANUFACTURING THE SAME

CROSS REFERENCE TO RELATED APPLICATION

This application is a National Phase application of, and claims priority to, PCT Application No. PCT/CN2011/078877, filed on Aug. 25, 2011, entitled "SEMICONDUCTOR STRUCTURE AND METHOD FOR MANUFACTURING THE SAME", which claimed priority to Chinese Application No. 201110175568.3, filed on Jun. 27, 2011. Both the PCT Application and Chinese Application are incorporated herein by reference in their entireties.

FIELD OF THE INVENTION

The present invention relates to semiconductor manufacturing field, particularity, to a semiconductor structure and a method for manufacturing the same.

BACKGROUND OF THE INVENTION

With development in the semiconductor manufacturing industry, integrated circuits with better performance and more powerful functions require greater element density; besides, sizes of and spaces between the components have to be further scaled down (which has already reached the nanometer-level nowadays). Accordingly, various micro effects come up along with downscaling in sizes of semiconductor devices. In order to meet the demands in developing semiconductor devices, persons skilled in the art are dedicated to exploring new manufacturing processes.

Silicon-On-Insulator (SOI) devices exhibit good feature of dielectric isolation, thus the integrated circuits made of SOI exhibit such advantages as small parasitic capacitance, high integrated density, fast operation speed, simple manufacturing process and alleviated short-channel effect. Usually, an SOI substrate mainly consists of three layers, which are respectively a body silicon layer, a Buried Oxide layer (BOX layer) on the body silicon layer, and an SOI layer on top of the BOX layer; the material of which is usually monocrystalline silicon.

In the prior art, when contacts to the source/drain regions are formed on a semiconductor device using aforesaid SOI substrate, contact resistances are relatively large, since the contact area between bottoms of the contacts and the source/drain regions becomes limited with downscaling of the device size. However, the contact resistances should be desirably reduced in order to enhance performance of the semiconductor device. As shown in FIG. 1, an SOI substrate may be etched first, for example, an SOI layer 11 and a BOX layer 12 on both sides of a gate structure 16 may be etched to form trenches, from which the BOX layer 12 is exposed; then, a metal layer 15 is formed inside the trenches, and the metal layer 15 is in contact with the SOI layer under the gate structure 16. Because resistivity of a metal is far lower than that of a semiconductor material, thus the semiconductor structure shown in FIG. 1 exhibits lowered contact resistances. However, said semiconductor structure still has shortcomings, for example, when a semiconductor device manufactured from said semiconductor structure is in operation, a relatively large capacitance shall arise between the metal layer 15 and the body silicon layer 13, which unfavorably impairs the performance of the semiconductor device.

SUMMARY OF THE INVENTION

The present invention aims to provide a semiconductor structure and a method for manufacturing the same, so as to reduce capacitance between a metal layer and a body silicon layer of an SOI layer.

In one aspect, the present invention provides a method for manufacturing a semiconductor structure, comprising:
a) providing an SOI substrate, and forming a gate structure on said SOI substrate;
b) etching an SOI layer of the SOI substrate and a BOX layer of the SOI substrate on both sides of the gate structure to form trenches, the trenches exposing the BOX layer and extending partly into the BOX layer;
c) forming sidewall spacers on sidewalls of the trenches;
d) forming, inside the trenches, a metal layer covering the sidewall spacers,
wherein the metal layer is in contact with the SOI layer which is under the gate structure.

In another aspect, the present invention further provides a method for manufacturing a semiconductor structure, comprising:
a) providing an SOI substrate, and forming a mask on the SOI substrate; the region overlaid with the mask is the region predetermined for forming a gate line;
b) etching an SOI layer of the SOI substrate and a BOX layer of the SOI substrate on both sides of the gate structure to form trenches, which expose the BOX layer and extend partly into the BOX layer;
c) forming sidewall spacers on sidewalls of the trenches;
d) forming, inside the trenches, a metal layer covering the sidewall spacers, wherein the metal layer is in contact with the SOI layer which is under the gate structure; and
e) removing the mask to expose the covered region, and forming a gate structure on the region.

Accordingly, the present invention further provides a semiconductor structure, which comprises an SOI substrate, a gate structure, a sidewall spacer and a metal layer; wherein:
the SOI substrate comprises an SOI layer and a BOX layer;
the gate structure is formed on the SOI layer;
The metal layer is formed within the SOI substrate and on both sides of the gate structure, the metal layer is in contact with the SOI layer which is under the gate structure and the metal layer extends into the BOX layer; and
the sidewall spacer is positioned between the metal layer and the BOX layer.

The present invention provides a semiconductor structure and a method for manufacturing the same, which lies in forming firstly trenches extending to a BOX layer on an SOI substrate, then forming sidewall spacers on sidewalls of the trenches, and forming a metal layer inside the trenches finally; because the sidewall spacers exhibit a thickness to certain extent, thus the distance between the metal layer and the body silicon layer of the SOI substrate becomes farther; besides, the area of the metal layer facing straight to the lower surface of the body silicon layer is becomes smaller, thus the extension of distance and decrease in the area reduce the capacitance between the metal layer and the body silicon layer of the SOI substrate when the semiconductor device is in operation, which therefore favorably enhances performance of the semiconductor device.

BRIEF DESCRIPTION OF THE DRAWINGS

Other characteristics, objectives and advantages of the present invention are made more evident according to perusal of the following detailed description of exemplary embodiment(s) in conjunction with accompanying drawings.

Same or similar reference signs in the accompanying drawings denote same or similar elements.

DETAILED DESCRIPTION OF THE INVENTION

Figure 1:
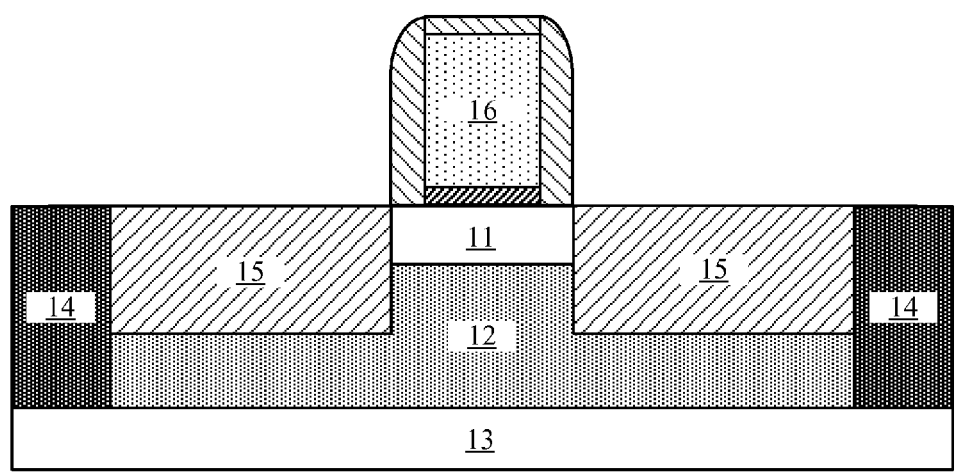
FIG. 1 illustrates a cross-sectional structure diagram of a semiconductor structure manufactured according to the prior art.

Objectives, technical solutions and advantages of the present invention are made more evident according to the following detailed description of exemplary embodiments in conjunction with the accompanying drawings.

Embodiments of the present invention are described here below, wherein examples of the embodiments are illustrated in the drawings, in which same or similar reference signs throughout denote same or similar elements or elements have same or similar functions. It should be appreciated that the embodiments described below in conjunction with the drawings are illustrative, and are provided for explaining the prevent invention only, thus shall not be interpreted as limitations to the present invention.

Various embodiments or examples are provided here below to implement different structures of the present invention. To simplify the disclosure of the present invention, description of the components and arrangements of specific examples is given below. Of course, they are illustrative only and not limiting the present invention. Moreover, in the present invention, reference numbers and/or letters may be repeated in different embodiments. Such repetition is for the purposes of simplification and clarity, yet does not denote the relationship between respective embodiments and/or arrangements being discussed. Furthermore, the present invention provides various examples for various process and materials. However, it is obvious for a person of ordinary skill in the art that other processes and/or materials may alternatively be utilized. In addition, the following structure in which a first feature is "on/above" a second feature may include an embodiment in which the first feature and the second feature are formed to be in direct contact with each other, and may also include an embodiment in which another feature is formed between the first feature and the second feature such that the first and second features might not be in direct contact with each other.

Here below, a preferred embodiment of a semiconductor structure provided by the present invention is described first; with reference to FIG. 8, which illustrates a cross-sectional structure diagram of a semiconductor structure provided by an embodiment of the present invention, the semiconductor structure comprises a gate structure 200, a sidewall spacer 160 and a metal layer 150, wherein:

the SOI substrate comprises an SOI layer 100 and a BOX layer 110;

The gate structure 200 is formed on the SOI layer 100;

the metal layer 150 is formed within the SOI substrate on both sides of the gate structure 200; the metal layer 150 is in contact with the SOI layer 100 under the gate structure 200 and extends into the BOX layer 110; and the sidewall spacer 160 is positioned between the metal layer 150 and the BOX layer 110.

Additionally, sidewall spacers 210 are further formed on both sides of the gate structure 200.

Preferably, a further sidewall spacer 160 is positioned between the metal layer 150 and an isolation regions 120 in the SOI substrate.

The SOI substrate is composed of at least three layers, which are respectively: a body silicon layer 130, a BOX layer 110 on the body silicon layer 130 and an SOI layer 100 on top of the BOX layer 110. $SiO_2$ is usually selected as a material for the BOX layer 110, whose thickness is usually larger than 100 nm; the material of the SOI layer 100 is monocrystalline silicon, Ge or a compound of III-V families. The SOI substrate used in the present embodiment is an SOI substrate with an ultrathin SOI layer 100, therefore the thickness of the SOI layer 100 is usually less than 100 nm, for example, 50 nm. Usually, isolation regions 120 are further formed within the SOI substrate to separate the SOI layer 100 into independent regions, which are used subsequently for manufacturing and forming transistor structures; the material of the isolation regions 120 is an insulating material, which for example may be $SiO_2$, $Si_3N_4$ or their combination. The width of the isolation regions 120 may be in dependence on the design requirements of a semiconductor structure.

The gate structure 200 comprises a gate dielectric layer and a gate stack. The sidewall spacers 210 may be formed from at least one material selected from a group consisting of $Si_3N_4$, $SiO_2$, $Si_2N_2O$, and SiC, as appropriate. The sidewall spacers 210 may be in a multi-layer structure. The sidewall spacers 210 may be formed through depositing-etching processes, with a thickness of about 10 nm-100 nm.

The metal layer 150 may comprise at least one material selected from a group consisting of W, Al, TiAl, and TiN. In the present embodiment, planarization treatment is implemented, such that the upper plane of the metal layer 150 becomes at the same level as the lower plane of the gate structure 200. The metal layer 150 is not only in contact with the SOI layer 100 and the BOX layer 110, but also is preferably in contact with the isolation regions 120. The thickness of the metal layer 150 is in the range of 50 nm~150 nm. In other embodiments, the metal layer 150 does not go through a planarization treatment, thus the neighboring semiconductor elements are electrically connected with the metal layer 150, so as to form local interconnect between the semiconductor elements.

Preferably, the material of the sidewall spacers 160 is a low-k material, for example, at least one material selected from a group consisting of $SiO_2$, SiOF, SiCOH, SiO, SiCO, and SiCON.

Figure 10:
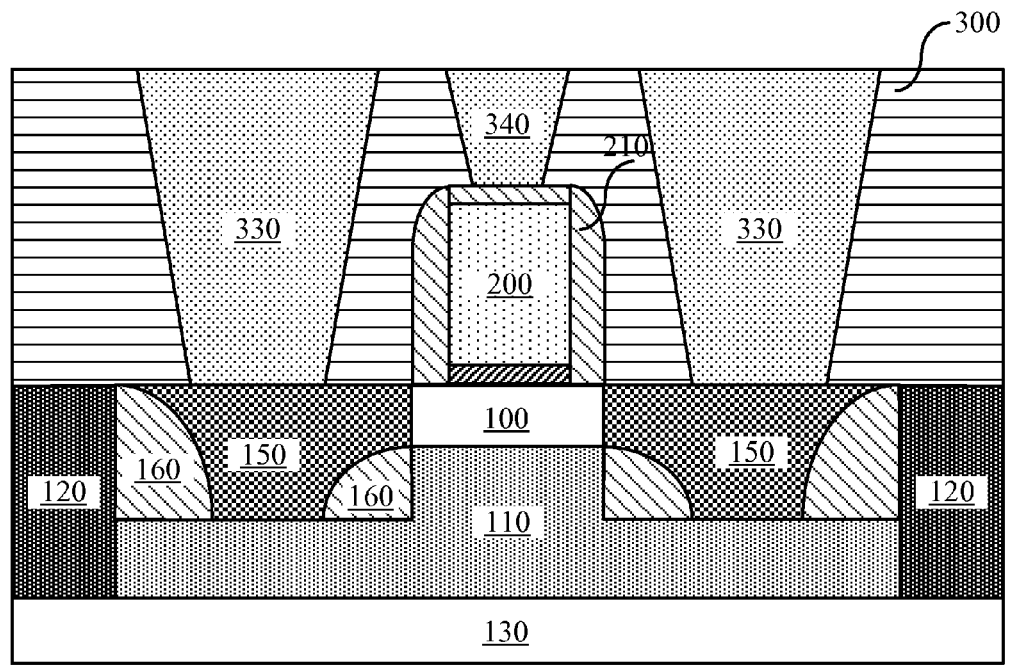

Optionally, as shown in FIG. 10, after implementation of subsequent manufacturing, the semiconductor structure further comprises a dielectric layer 300 covering the gate structure 200 and the metal layer 150; the dielectric layer 300 internally comprises: first contacts 330 in contact with the metal layer 150, and/or a second contact 340 in contact with the gate structure 200. The dielectric layer 300 may comprise at least one material selected from a group consisting of $SiO_2$, carbon doped $SiO_2$, BPSG, PSG, UGS, $Si_2N_2O$, and a low-k material, and the thickness of the dielectric layer 300 may be 40 nm-150 nm, for example, 80 nm, 100 nm or 120 nm; the first contacts 330 and the second contact 340 are embedded within the dielectric layer 300, and their material may be at least one material selected from a group consisting of W, Al and TiAl alloy. It should be noted that in a Gate Last Process, if the gate structure 200 is a dummy gate, the dummy gate should be replaced with a gate stack structure prior to formation of the dielectric layer 300.

In the same semiconductor device, aforesaid embodiment or any other semiconductor structure as appropriate may be included in view of manufacturing needs.

Aforesaid embodiment is further described here below in conjunction with the method for manufacturing a semiconductor structure provided by the present invention.

Figure 2A:
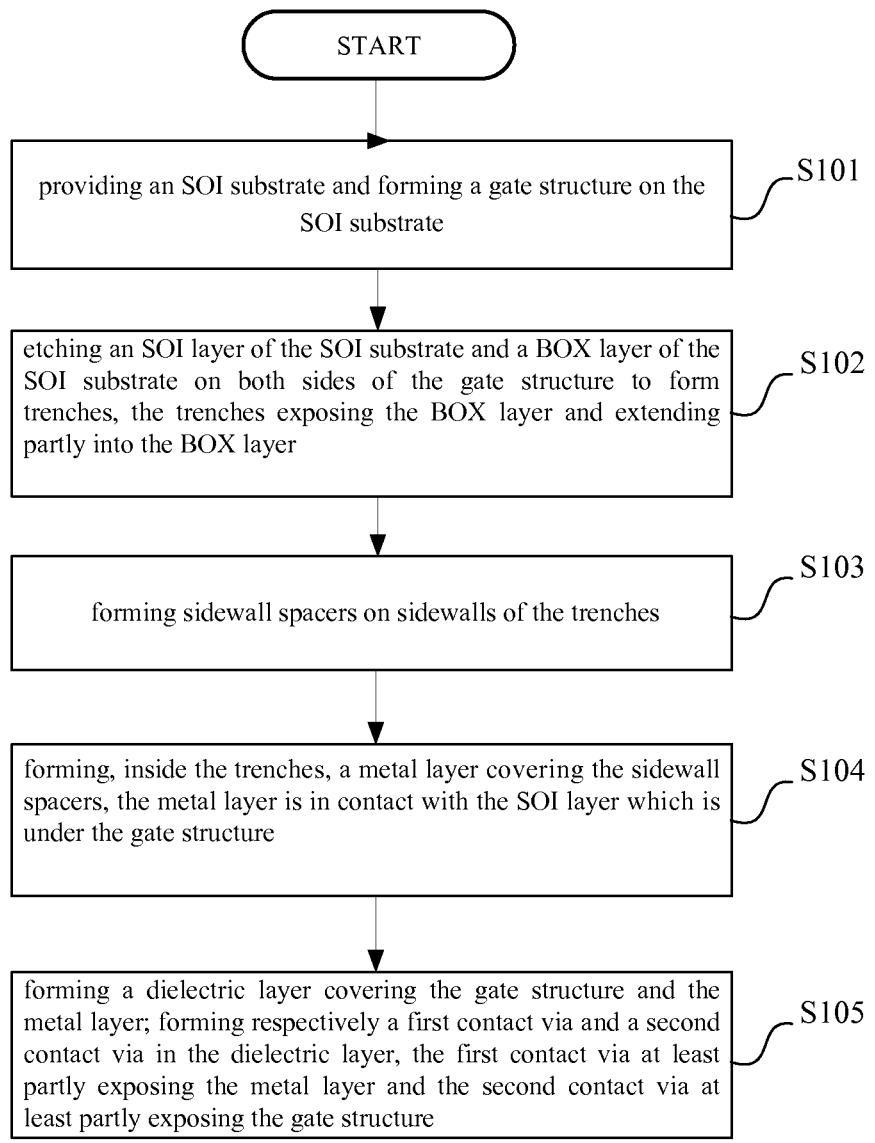
FIG. 2(a) illustrates a flowchart of a method for manufacturing a semiconductor structure according to an embodiment of the present invention.

With reference to FIG. 2(a), which illustrates a flowchart of a method for manufacturing a semiconductor structure according to an embodiment of the present invention; wherein the method comprises:

at step S101, providing an SOI substrate and forming a gate structure on the SOI substrate;

at step S102, etching an SOI layer and a BOX layer of the SOI substrate on both sides of the gate structure to form trenches, which expose the BOX layer and partly extend into the BOX layer;

at step S103, forming sidewall spacers on sidewalls of the trenches;

at step S104, forming, inside the trenches, a metal layer covering the sidewall spacers; the metal layer is in contact with the SOI layer under the gate structure.

Step S101 through step S103 are described below in conjunction with FIG. 3 to FIG. 8, which illustrate cross-sectional structural diagrams of a semiconductor structure at respective manufacturing stages according to the flowchart of the embodiment of the present invention, as shown in FIG. 1. It should be noted that the drawings for the respective embodiments are illustrative only, thus are not necessarily drawn to scale.

Figure 3:
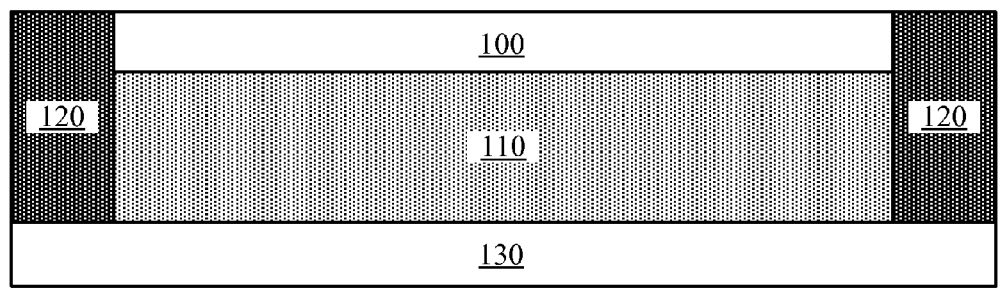
FIG. 3 to FIG. 10 illustrate cross-sectional structural diagrams of a semiconductor structure at respective stages of the method for manufacturing a semiconductor structure according to the flowchart of the embodiment of the present invention as shown in FIG. 2 (a)
Figure 4:
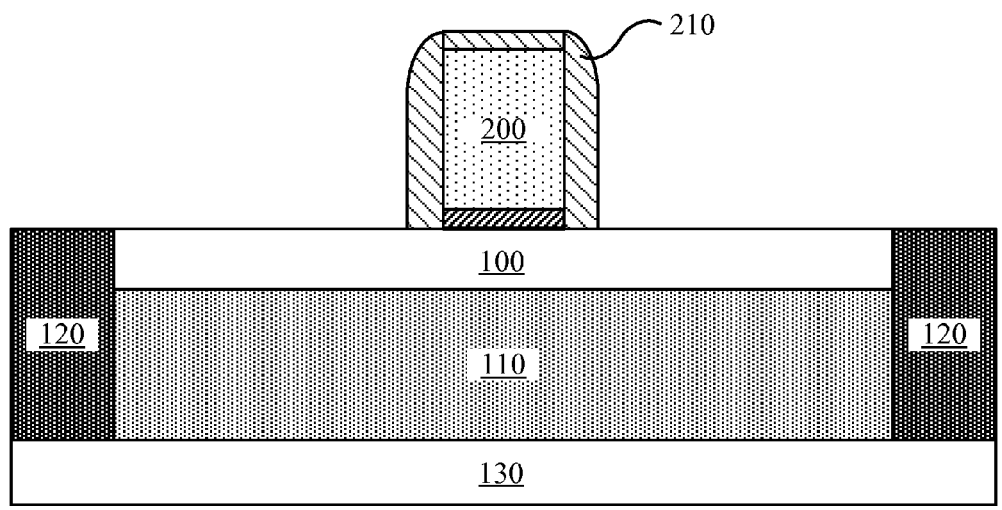

With reference to FIG. 3 and FIG. 4, step S101 is performed to provide an SOI substrate and to form a gate structure 200 on the SOI substrate.

First, as shown in FIG. 3, the SOI substrate consists of at least three layers, which are respectively: a body silicon layer 130, a BOX layer 110 on the body silicon layer 130 and an SOI layer 100 on top of the BOX layer 110. $SiO_2$ is usually selected as the material of the BOX layer 110, whose thickness is usually larger than 100 nm; the material of the SOI layer 100 is monocrystalline silicon, Ge or a compound of III-V families; the SOI substrate used in the present embodiment is an SOI substrate with an ultrathin SOI layer 100, thus the thickness of the SOI layer 100 is usually less than 100 nm, for example, 50 nm. Usually, isolation regions 120 are further formed within the SOI substrate to separate the SOI layer 100 into independent regions, which are used for manufacturing and forming transistor structures in subsequent processes; the material of the isolation regions 120 is an insulating material which, for example, may be $SiO_2$, $Si_3N_4$ or their combination; the width of the isolation region 120 may be in dependence on demands in designing a semiconductor structure.

Next, as shown in FIG. 4, a gate structure 200 is formed on the SOI substrate; in a Gate First Process, the formation of the gate structure 200 goes as below: forming a gate dielectric layer on top of the SOI layer 100 and the isolation regions 120, a gate metal layer on top of the gate dielectric layer, a gate electrode layer on top of the gate metal layer, an oxide layer on top of the gate electrode layer, a nitride layer on top of the oxide layer, and a photoresist layer on top of the nitride layer and patterned for forming a gate stack through etching; wherein, the material of the gate dielectric layer may be a thermal oxide layer, including SiO2 or Si2N2O, or may be a high-k dielectric, for example, at least one material selected from a group consisting of HfO2, HfSiO, HfSiON, HfTaO, HfTiO, HfZrO, Al2O3, La2O3, ZrO2, and LaAlO, with a thickness in the range of 1 nm~4 nm; the gate metal layer may comprise at least one material selected from a group consisting of TaC, TiN, TaTbN, TaErN, TaYbN, TaSiN, HfSiN, MoSiN, RuTax and NiTa, with a thickness in the range of 5 nm~20 nm; Poly-Si may be selected as the material of the gate electrode layer, whose thickness is in the range of 20 nm~80 nm; the material of the oxide layer is SiO2, and its thickness is in the range of 5 nm~10 nm; the material of the nitride layer is Si3N4, and its thickness is in the range of 10 nm~50 nm; the material of the photoresist layer may be a vinyl monomer material, a material including quinoneazide compound or a material of Polyethylene monolaurate or the like. Except for the photoresist layer in the abovementioned multi-layer structure, other layers therein may be formed sequentially on the SOI layer 100 by means of Chemical Vapor Deposition, High-density Plasma CVD, ALD, Plasma Enhanced Atomic Layer Deposition, Pulsed Laser Deposition or other method as appropriate. After the photoresist layer is patterned, aforesaid multi-layer structure may be etched to form a gate structure 200 as shown in FIG. 4.

In a Gate Last process, the gate structure 200 comprises a dummy gate and a gate dielectric layer carrying the dummy gate; thus it is applicable to implement gate replacement process in subsequent steps, where the dummy gate is removed to form a desired gate stack structure.

Usually, it is applicable to form sidewall spacers 210 on both sides of the gate structure 200 in order to isolate the gate structure 200, after formation of the gate structure 200. The sidewall spacers 210 may be formed from at least one material selected from a group consisting of $Si_3N_4$, $SiO_2$, $Si_2N_2O$, and SiC, as appropriate. The sidewall spacers 210 may be in a multi-layer structure. The sidewall spacers 210 may be formed through depositing-etching process, with a thickness in the range of about 10 nm~100 nm.

Figure 5:
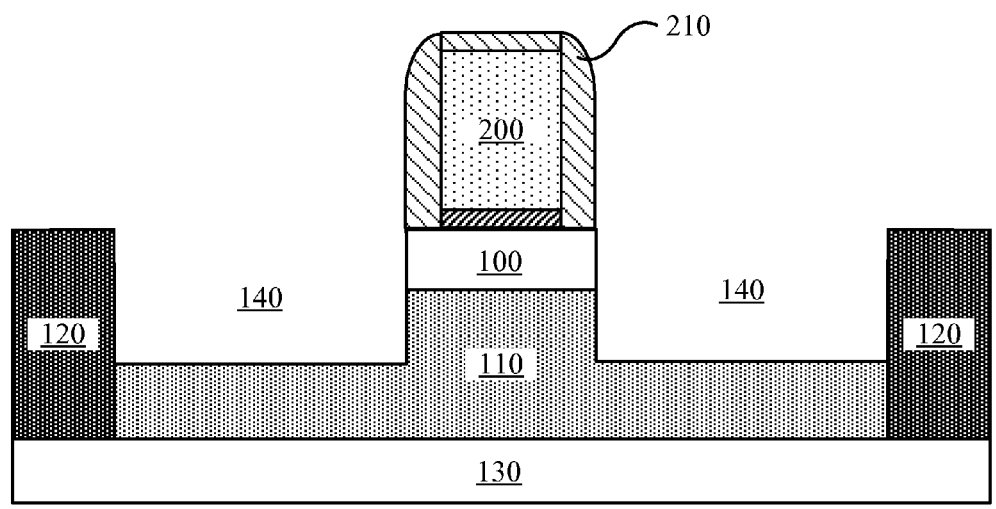

With reference to FIG. 5, step S102 is implemented to etch an SOI layer 100 and a BOX layer 110 of the SOI substrate on both sides of the gate structure 200 so as to form trenches 140, which expose the BOX layer 110 and extend at least partly into the BOX layer 110. Specifically, the SOI layers 100 on both sides of the gate structure 200 are removed first by means of an etching process as appropriate, then portions of the exposed BOX layers 110 are removed to form trenches 140, which therefore not only expose the remaining portions of the BOX layers 110 but also replace partly the un-etched BOX layers 110 in terms of space; the trenches 140 extend partly into the BOX layer 110. The depth of the trenches 140 is the sum of the thickness of the SOI layer 100 etched away and the thickness of the BOX layer 110 etched away; in view of the SOI substrate applied in the present embodiment, the thickness of the BOX layer 110 is usually larger than 100 nm, and the thickness of the Ultrathin SOI layer 100 is 20 nm~30 nm; accordingly, the depth of the trenches 140 is in the range of 50 nm~150 nm.

Figure 6:
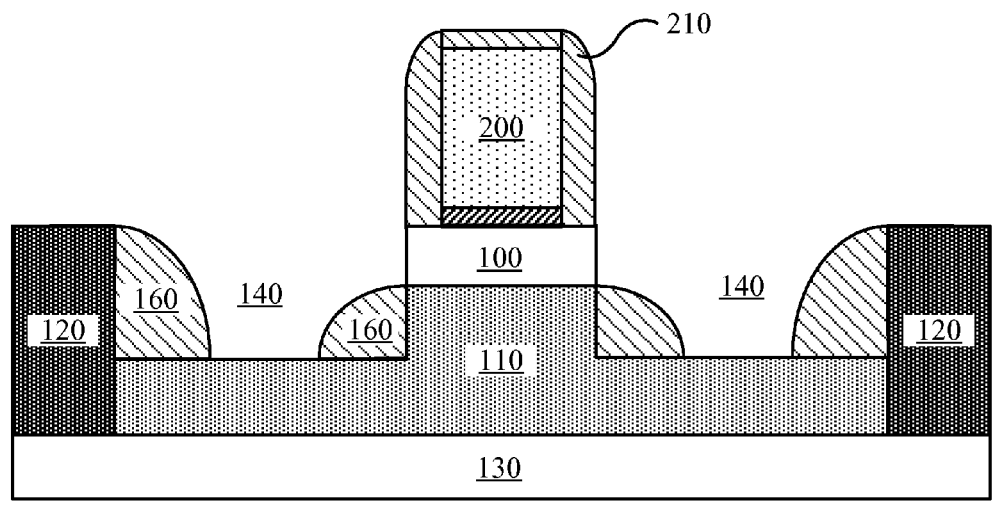

With reference to FIG. 6, step S103 is implemented to form sidewall spacers 160 on sidewalls of the trenches 140. The sidewall spacers 160 may be formed on sidewalls of the trenches 140 by means of an appropriate deposition method or a selective growth method. In the present embodiment, the trenches 140 are wide and expose partly the isolation region 120. As shown in FIG. 6, the sidewall spacers 160 in the present embodiment are formed on sidewalls of the exposed BOX layer 110 and on sidewalls of the exposed isolation regions 120. The formation of the sidewall spacers 160 in the present embodiment goes as below: first, overlying photoresist or a mask on the entire gate stack and the portions adjacent to the sidewalls of the gate stack; next, etching to form sidewall spacers 160 closely adjacent to the STIs 120, removing the photoresist or the mask; then, overlying photoresist or a mask on the STIs 120 and the sidewall spacers 160 formed from etching that are closely adjacent to the STIs 120; and then, etching to form sidewall spacers 160 closely adjacent to the sidewalls of the BOX 110. A person of ordinary skill in the art should appreciate that, aforesaid etching step may consists of at least three steps; for example, etching for the first time with the sidewall spacer 210 functioning as a stop layer; next, etching for the second time with the SOI layer 100 functioning as a stop layer, and finally etching for the third time with a sidewall of the BOX 110 functioning as a stop layer, till sidewall spacers 160 is shaped as shown in FIG. 6. However, a person of ordinary skill in the art may also shape sidewall spacers 160 as shown in FIG. 6 by means of any other conventional etching process.

Figure 7:
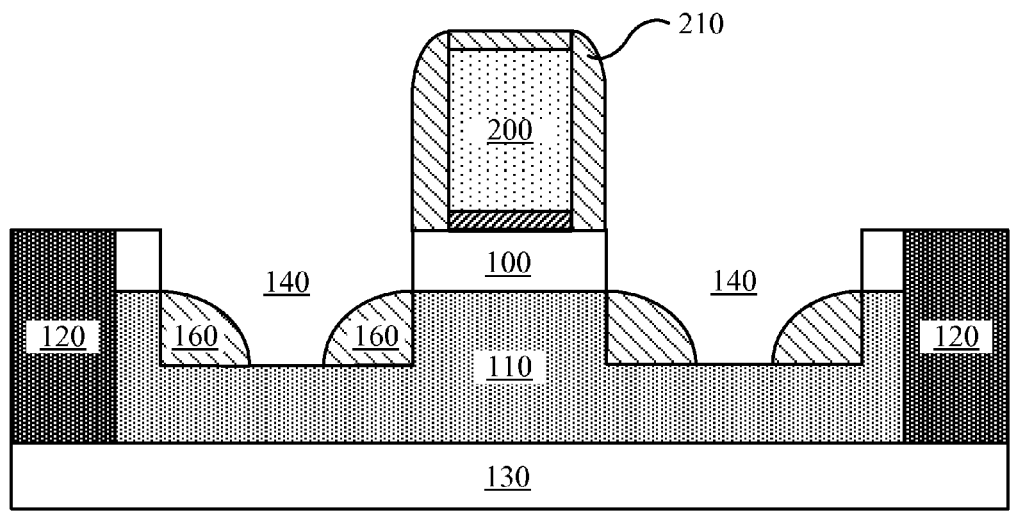

In another embodiment, the trenches 140 formed in a semiconductor structure as shown in FIG. 7 are not very wide, thus the isolation regions 120 are not exposed; accordingly, the sidewall spacers 160 are formed on the sidewalls of the exposed BOX layer only. Preferably, the material of the sidewall spacers 160 is a low-k material, for example, at least one material selected from a group consisting of $SiO_2$, SiOF, SiCOH, SiO, SiCO, and SiCON. A person of ordinary skill in the art should also appreciate that the sidewall spacers 160 may be shaped as shown in FIG. 7 through etching by means of aforesaid process or other process as appropriate.

Figure 8:
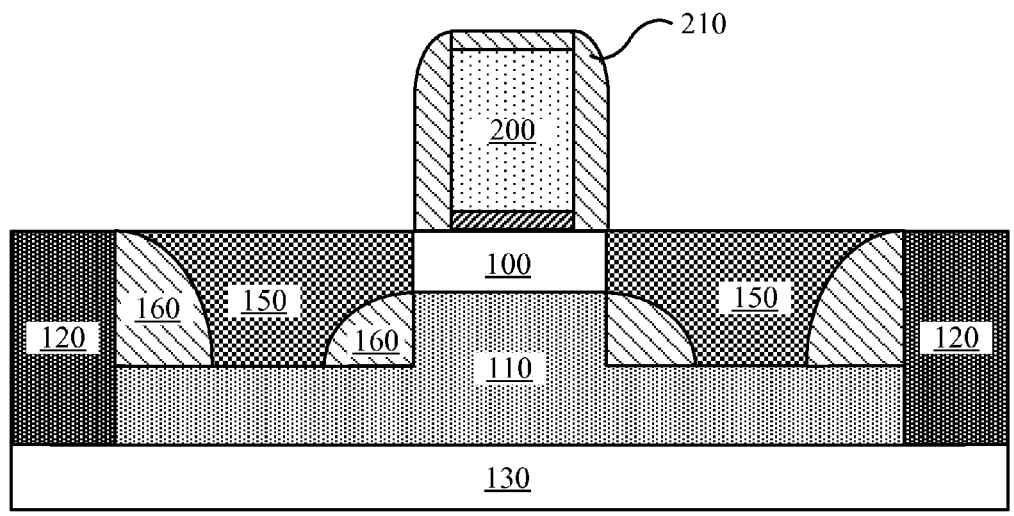

As shown in FIG. 8, step S104 is performed to form, inside the trenches 140, a metal layer 150 covering the sidewall spacers 16 and being in contact with the SOI layer 100 under the gate structure 200. The metal layer 150 may comprise at least one material selected from a group consisting of W, Al, TiAl, and TiN. The metal layer 150 may be formed inside the trenches 140 by means of a deposition process as appropriate, for example, a CVD process.

In the present embodiment, after the metal layer 150 has been formed, planarization treatment may be performed to the metal layer 150 through chemical mechanical polishing, such that the upper plane of the metal layer 150 becomes at the same level as the lower plane of the gate structure 200. In subsequent manufacturing processes of the semiconductor structure, it may be further necessary to form contact vias exposing the metal layer 150, and it is applicable to extend the area of the metal layer 150, in order to reduce alignment difficulty of etching; in view of aforesaid concerns, it is optionally to extend the range of the SOI substrate at step S102, such that the formed trenches 140 has a larger area, which is favorable for reducing alignment difficulty of etching in subsequent processes; for example, the SOI layer 100 between the gate structure 200 and the isolation region 120 is completely etched and the BOX layer 110 is partly etched, such that the trenches 140 expose partly the isolation regions 120. Accordingly, the upper plane of the metal layer 150 formed at step S104 has a relatively large area.

In other embodiments, aforesaid CMP step is not necessary; instead, the metal layer 150 may be etched to a certain extent, such that neighboring semiconductor elements are electrically connected with the metal layer 150.

Figure 9:
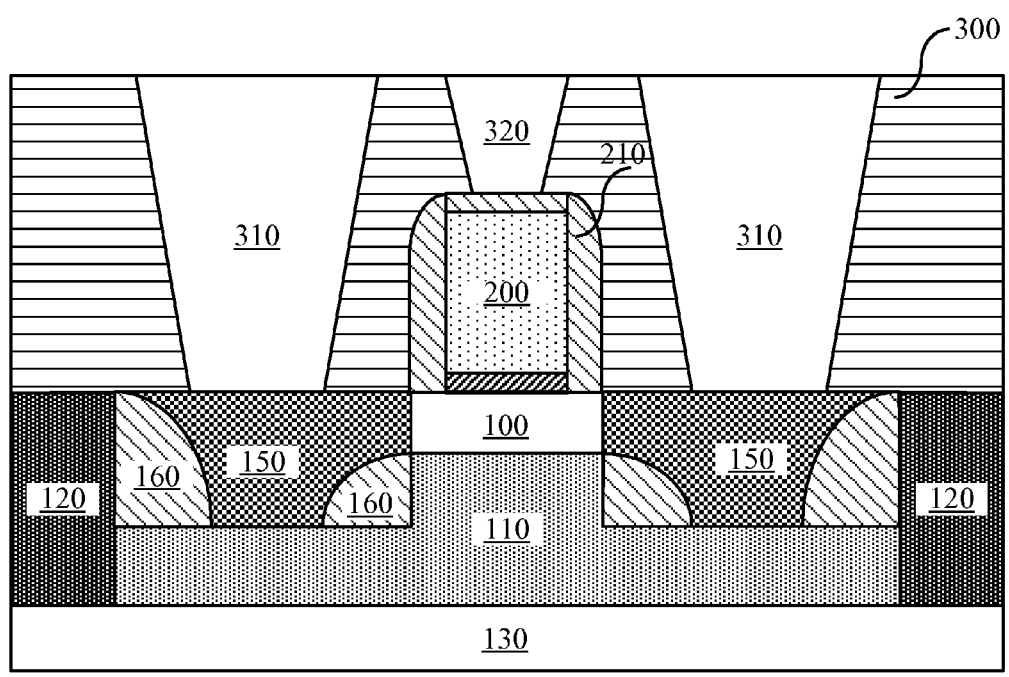

Optionally, as shown in FIG. 9, the method provided in the present embodiment may further comprise step S105, which specifically consists of: forming a dielectric layer 300 covering the gate structure 200 and the metal layer 150; forming respectively first contact vias 310 at least partly exposing the metal layer 150 and a second contact via 320 at least partly exposing the gate structure 200, within the dielectric layer 300. The dielectric layer 300 may be formed by means of CVD, High-density Plasma CVD, spin coating or other method as appropriate. The dielectric layer 300 may comprise at least one material selected from a group consisting of $SiO_2$, carbon doped $SiO_2$, BPSG, PSG, UGS, $Si_2N_2O$, and a low-k material. After the dielectric layer 300 goes through CMP processing, the thickness of the dielectric layer 300 usually may be in the range of 40 nm-150 nm, for example, 80 nm, 100 nm or 120 nm. As shown in FIG. 9, the first contact vias 310 extending through the dielectric layer 300 stop on the metal layer 150 and at least partly expose the metal layer 150, while the second contact via 320 extending through the dielectric layer 300 on the gate structure 200 at least partly expose the gate structure 200. Prior to the formation of the dielectric layer 300, the gate structure 200 is usually processed to become an exposed metal gate 200. At the time of forming first contact vias 310 and second contact via 320 through etching the dielectric layer 300 by means of dry etching, wet etching or another etching method as appropriate, the metal layer 150 may function as a stop layer for etching to form the first contact vias 310, and the upper plane of the metal gate 200 may function as a stop layer for etching to form the second contact via 320; therefore, corresponding stop layers are provided at the time of etching to form the first contact vias 310 and the second contact via 320 respectively; in this way, the controlling requirement for etching process is loosened, namely, the difficulty of etching is alleviated. During subsequent processes, the first contact vias 310 and the second contact via 320 are usually filled with a metal to form the first contacts 330 and the second contact 340, as shown in FIG. 10; preferably, the metal is W. Of course, the metal may comprise at least one material selected from a group consisting of W, Al and TiAl, according to semiconductor manufacturing needs.

Figure 2B:
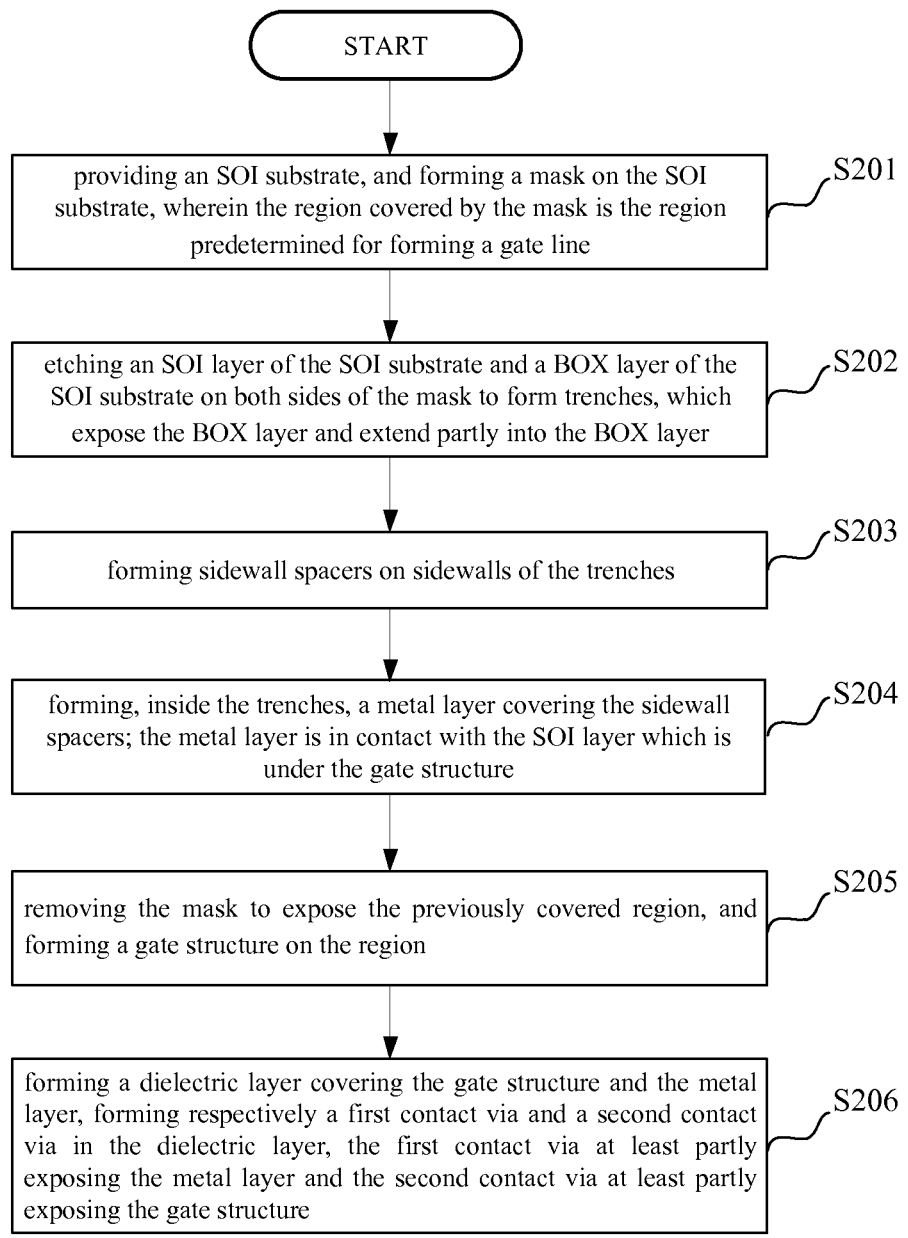
FIG. 2(b) illustrates a flowchart of another method for manufacturing a semiconductor structure according to another embodiment of the present invention.

With reference to FIG. 2(b), which illustrates a flowchart of another method for manufacturing a semiconductor structure provided by another embodiment of the present invention; the method comprises:

at Step S201, providing an SOI substrate, and forming a mask on the SOI substrate, wherein a region overlaid with the mask is the region predetermined for forming gate lines;

at step S202, etching an SOI layer and a BOX layer of the SOI substrate on both sides of the mask to form trenches, which expose the BOX layer and extend partly into the BOX layer;

at step S203, forming sidewall spacers on sidewalls of the trenches;

at step S204, forming, inside the trenches, a metal layer covering the sidewall spacers; the metal layer is in contact with the SOI layer under the gate structure; and at step S205, removing the mask to expose the previously covered region, and forming a gate structure on said region.

Here below, steps S201 through S205 are described in conjunction with FIG. 11 to FIG. 15, which illustrate cross-sectional structural diagrams of a semiconductor structure at respective stages of the method for manufacturing a semiconductor structure according to the flowchart of the embodiment of the present invention, as shown in FIG. 2 (b). It should be noted that the drawings for the respective embodiments of the present invention are illustrative only, thus they are not necessarily drawn to scale.

The method shown in FIG. 2 (b) differs from the method shown in FIG. 2 (a) at: in view of the flowchart shown in FIG.

2(a), a gate structure is formed first on a substrate, trenches is formed through etching, then sidewall spacers are further formed on sidewalls of the trenches, and finally a metal layer covering the sidewalls is formed inside the trenches; whereas, in view of the flowchart of the method shown in FIG. 2(b), a mask is formed first on a substrate so as to cover the region where a gate structure is to be formed; then, alike to the steps shown in FIG. 2 (a), trenches are formed through etching, and sidewall spacers are further formed on sidewalls of the trenches, and then a metal layer covering the sidewall spacers are formed inside the trenches; noticeably, the difference lies in that the mask is finally removed, and then a gate structure is formed at said region, from which the mask has been removed.

The steps for forming and removing the mask is described in detail here below, while other steps same as those in the flowchart illustrated in FIG. 2 (a) may be referred to from the related foregoing description, thus are not described here in order not to obscure.

Figure 11:
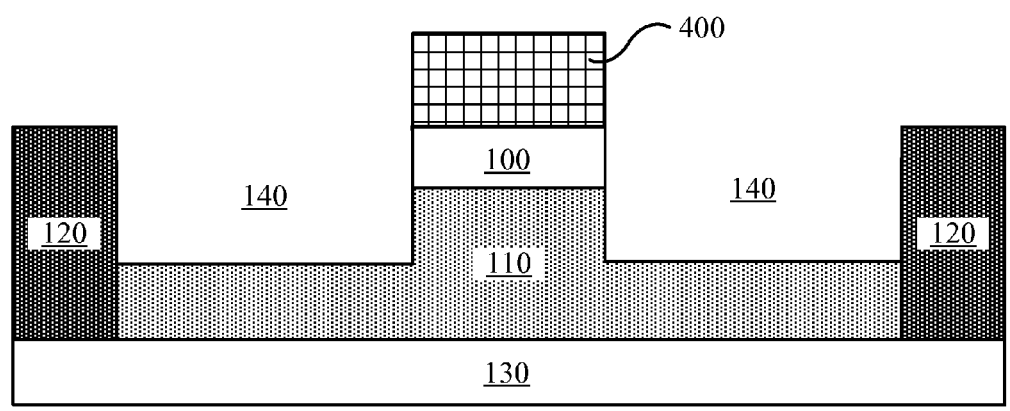
FIG. 11 to FIG. 15 illustrate cross-sectional structural diagrams of a semiconductor structure at respective stages of the method for manufacturing a semiconductor structure according to the flowchart of the embodiment of the present invention as shown in FIG. 2 (b).

As shown in FIG. 11, an SOI substrate is overlaid with a mask 400, wherein photoresist is usually selected as the mask. Next, the photoresist mask is patterned by means of lithography process; then, a desired shape is formed from the patterned photoresist mask through etching, which is namely the shape of gate lines in the present invention. Then, trenches 140 are formed through etching, whose depth is in the range of 50 nm~150 nm. The trenches 140 expose partly isolation regions 120 of the SOI substrate.

Figure 12:
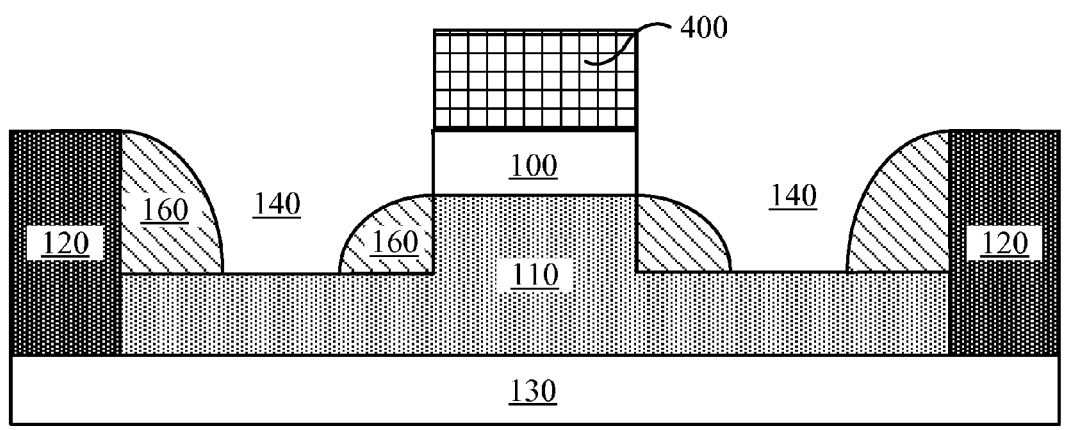
Figure 15:
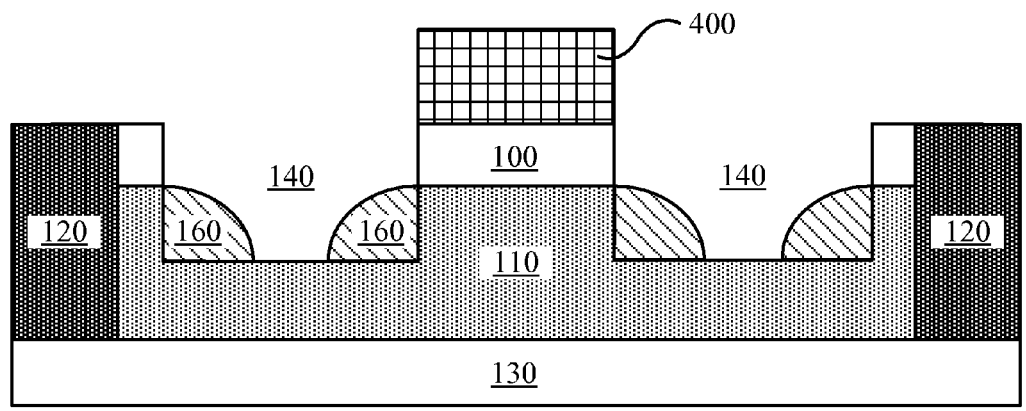

Sidewall spacers 160 are formed on sidewalls of the trenches 140. The sidewall spacers comprise a low-k material. As shown in FIG. 12, the sidewall spacers 160 may be formed on sidewalls of the exposed BOX layer 110 and on sidewalls of the exposed isolation region 120. Additionally, it is applicable not to expose the isolation regions 120, and in this case the sidewall spacers 160 are formed merely on sidewalls of the exposed BOX layer, as shown in FIG. 15.

Figure 13:
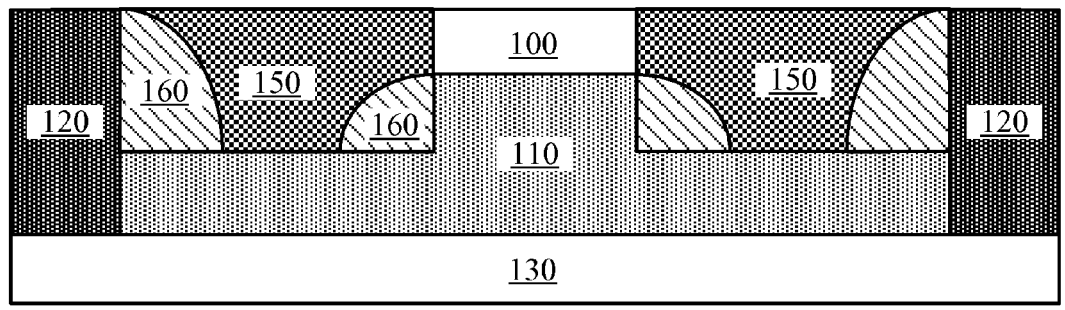

As shown in FIG. 13, a metal layer 150 covering the sidewall spacers 160 is formed inside the trenches 140. The metal layer 150 may comprise at least one material selected from a group consisting of W, Al, TiAl, and TiN. After formation of the metal layer 150, the mask is removed; optionally, planarization treatment is performed, such that the upper surfaces of metal layer 150, the SOI layer 100 and the isolation region 120 are all at the same level.

Figure 14:
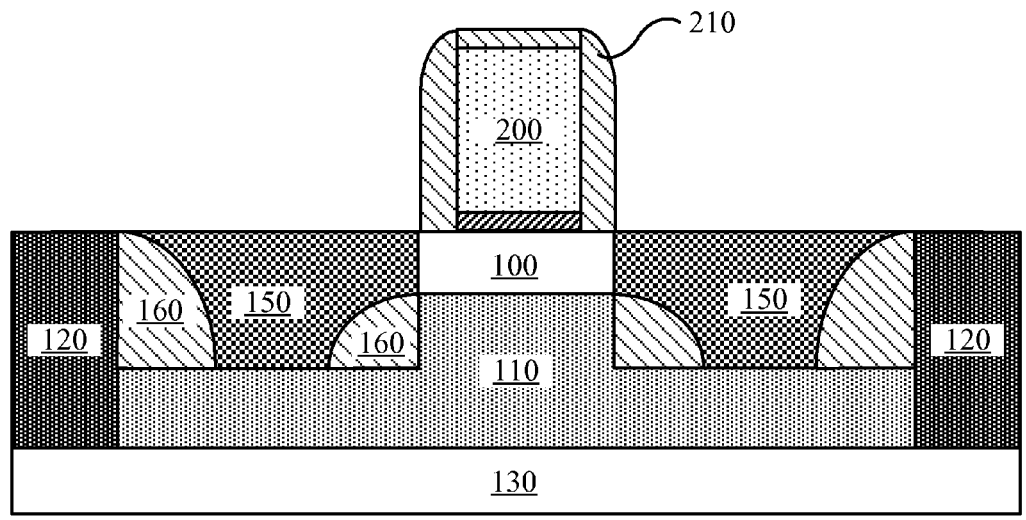

As shown in FIG. 14, a gate structure 200 is formed on the region previously covered by the mask. Optionally, sidewall spacers 210 may be further formed on both sides of the gate structure 200. Optionally, source/drain regions may be further formed within the SOI substrate.

Optionally, the method provided in the present embodiment may further comprise step S206, which specifically consists of: forming a dielectric layer 300 covering the gate structure 200 and the metal layer 150, forming respectively the first contact vias 310 at least partly exposing the metal layer 150 and the second contact via 320 at least partly exposing the gate structure 200, within the dielectric layer 300. With reference to FIG. 9, the detailed description about the flowchart of forming the contact vias may be referred to from the related foregoing description herein, thus it is not described here in order not to obscure.

According to the semiconductor structure and the method for manufacturing the same provided by the present invention, trenches 140 extending into a BOX layer 110 are first formed on an SOI substrate, then sidewall spacers 160 are formed on sidewalls of the trenches 140, and a metal layer is finally formed inside the trenches. Owing to formation of the sidewall spacers 160 and controllable thickness of the sidewall spacers 160, the metal layer 150 is separated farther apart from the body silicon layer 130 of the SOI substrate by the sidewall spacers 160, that is, the distance between the two becomes farther; moreover, because the sidewall spacers 160 occupy partly the surface of the exposed BOX layer 110, thus the area of the metal layer facing straight to the lower surface of the body silicon layer 130 becomes smaller; as such, the extension of distance and decrease in the area reduce the capacitance between the metal layer 150 and the body silicon layer 130 of the SOI substrate when the semiconductor device is in operation, which therefore is favorable for enhancing performance of the semiconductor device and guaranteeing a sufficient contact area between the metal contacts and source and drain regions.

Although exemplary embodiments and their advantages have been described herein in detail, it should be understood that various alternations, substitutions and modifications may be made to the embodiments without departing from the spirit of the present invention and the scope as defined by the appended claims. As for other examples, it may be easily appreciated by a person of ordinary skill in the art that the order of the process steps may be changed without departing from the scope of the present invention.

In addition, the scope, to which the present invention is applied, is not limited to the process, mechanism, manufacture, material composition, means, methods and steps described in the specific embodiments in the specification. According to the disclosure of the present invention, a person of ordinary skill in the art should readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for manufacturing a semiconductor structure, which comprises:
   a) providing an SOI substrate, and forming a gate structure (200) on the SOI substrate;
   b) etching an SOI layer (100) of the SOI substrate and a BOX layer (110) of the SOI substrate on both sides of the gate structure (200) to form trenches (140), the trenches exposing the BOX layer (110) and extending partly into the BOX layer (110);
   c) forming sidewall spacers (160) on sidewalls of the trenches (140); and
   d) forming inside the trenches (140) a metal layer (150) covering the sidewall spacers (160), wherein the metal layer (150) is in contact with the SOI layer (100) which is under the gate structure (200).

2. A method for manufacturing a semiconductor structure, comprising:
   a) providing an SOI substrate, forming a mask (400) on the SOI substrate, wherein a region covered by the mask is the region predetermined for forming a gate line;
   b) etching an SOI layer (100) of the SOI substrate and a BOX layer (110) of the SOI substrate on both sides of the mask (400) to form trenches (140), which expose the BOX layer (110) and extend partly into the BOX layer (110);
   c) forming sidewall spacers (160) on sidewalls of the trenches (140);

d) forming inside the trenches (140) a metal layer (150) covering the sidewall spacers (160), wherein the metal layer (150) is in contact with the SOI layer (100) which is under the gate structure (200); and e) removing the mask to expose the covered region, and forming a gate structure (200) on the region.

3. The method of claim 1, wherein:
the trenches (140) have a depth in a range of 50 nm~150 nm.

4. The method of claim 1, wherein:
the trenches (140) expose partly isolation regions (120) of the SOI substrate.

5. The method of claim 1, wherein:
the metal layer (150) comprises at least one material selected from a group consisting of W, Al, TiAl, and TiN.

6. The method of claim 1, wherein:
the material of the sidewall spacers (160) is a low-k material.

7. The method of claim 1, which further comprises:

f) forming a dielectric layer (300) covering the gate structure (200) and the metal layer (150), and forming respectively a first contact via (310) and a second contact via in the dielectric layer (300), the first contact via (310) at least partly exposing the metal layer (150), and the second contact via (320) at least partly exposing the gate structure (200).

8. A semiconductor structure, which comprises an SOI substrate, a gate structure (200), a sidewall spacer (160), and a metal layer (150), wherein:
the SOI substrate comprises an SOI layer (100) and a BOX layer (110);
the gate structure (200) is formed on the SOI layer (100);
the metal layer (150) is formed within the SOI substrate and on both sides of the gate structure (200), wherein the metal layer (150) is in contact with the SOI layer (100) which is under the gate structure (200), and the metal layer (150) extends into the BOX layer (110); and
the sidewall spacer (160) is positioned between the metal layer (150) and the BOX layer (110).

9. The semiconductor structure of claim 8, wherein:
the metal layer (150) has a thickness in a range of 50 nm~150 nm.

10. The semiconductor structure of claim 8, wherein:
a further sidewall spacer (160) is positioned between the metal layer (150) and an isolation region (120) in the SOI substrate.

11. The semiconductor structure of claim 8, wherein:
the metal layer (150) comprises at least one material selected from a group consisting of W, Al, TiAl, and TiN.

12. The semiconductor structure of claim 8, wherein
the material of the sidewall spacer (160) is a low-k material.

13. The semiconductor structure of claim 12, wherein the semiconductor structure further comprises a dielectric layer (300) covering the gate structure (200) and the metal layer (150), and wherein the dielectric layer (300) comprises:
a first contact (330) in contact with the metal layer (150); and/or
a second contact (340) in contact with the gate structure (200).

14. The method of claim 2, wherein the trenches (140) have a depth in a range of 50 nm~150 nm.

15. The method of claim 2, wherein the trenches (140) expose partly isolation regions (120) of the SOI substrate.

16. The method of claim 2, wherein the metal layer (150) comprises at least one material selected from a group consisting of W, Al, TiAl, and TiN.

17. The method of claim 2, wherein
the material of the sidewall spacers (160) is a low-k material.

18. The method of claim 2, which further comprises:

f) forming a dielectric layer (300) covering the gate structure (200) and the metal layer (150), and forming respectively a first contact via (310) and a second contact via in the dielectric layer (300), the first contact via (310) at least partly exposing the metal layer (150), and the second contact via (320) at least partly exposing the gate structure (200).

* * * * *